United States Patent [19]

Müller et al.

[11] Patent Number: 5,723,337
[45] Date of Patent: Mar. 3, 1998

[54] METHOD FOR MEASURING AND CONTROLLING THE OXYGEN CONCENTRATION IN SILICON MELTS AND APPARATUS THEREFOR

[75] Inventors: Georg Müller, Birkenstrasse 17, D-91094 Langensendelbach; Rainer Marten; Albrecht Seidl, both of Erlangen, all of Germany

[73] Assignee: Georg Müller, Langensendelbach, Germany

[21] Appl. No.: 511,752

[22] Filed: Aug. 7, 1995

[30] Foreign Application Priority Data

Aug. 13, 1994 [DE] Germany ............ 44 28 743.7

[51] Int. Cl.⁶ ............ G01N 33/20; G01N 27/26; G01N 27/411
[52] U.S. Cl. ............ 436/55; 73/DIG. 9; 117/15; 117/202; 422/62; 436/75; 436/138
[58] Field of Search ............ 436/55, 75, 127, 436/136, 138; 422/82.01–82.04, 62; 73/DIG. 9; 117/13–15, 20, 29, 201, 202, 916; 204/422

[56] References Cited

U.S. PATENT DOCUMENTS

| 4,007,106 | 2/1977 | Hone et al. | 204/422 |
|---|---|---|---|
| 4,330,359 | 5/1982 | Shlichta | 117/29 |
| 4,400,232 | 8/1983 | Ownby et al. | 117/15 |
| 4,496,424 | 1/1985 | Terashima et al. | 117/29 |
| 5,041,186 | 8/1991 | Nishio et al. | 117/15 |

FOREIGN PATENT DOCUMENTS

| 0 425 837 A1 | 5/1991 | European Pat. Off. |
| 2050164 | 4/1977 | Japan . |
| 3142385 | 12/1978 | Japan . |
| 2217389 | 8/1990 | Japan . |

OTHER PUBLICATIONS

Willard et al. *Instrumetal Methods of Analysis* Sixth Edition, Wadsworth Publishing (Belmont CA) 1981, pp. 640–645.

*Primary Examiner*—Jan Ludlow
*Attorney, Agent, or Firm*—Browdy and Neimark

[57] ABSTRACT

A method for measuring and controlling the oxygen concentration in silicon melts which are contained in a silica glass crucible or which can be touched by a silica glass surface can especially be used for achieving a defined, uniform axial and radial oxygen concentration in a growing silicon crystal. The measurement of the oxygen concentration is realized by an electrochemical solid ionic sensor dipped into the melt; the voltage is measured between the sensor and the growing silicon crystal. The oxygen concentration in the melt is controlled by applying a voltage between crystal and silica glass crucible. The apparatus for putting the method into practice includes an electrochemical solid ionic sensor formed of a silica glass tube which encloses a metal/metal oxide mixture, contacted by a metal wire.

2 Claims, 3 Drawing Sheets

METHOD FOR MEASURING AND CONTROLLING THE OXYGEN CONCENTRATION IN SILICON MELTS AND APPARATUS THEREFOR

BACKGROUND OF THE INVENTION

1. Field of the Invention

The invention relates to a method and an apparatus for measuring and controlling the oxygen concentration in silicon melts, in particular connected with the production of silicon of silicon single crystals by the Czochralski method.

2. Background Art

Such a method is known from the EP o 425 837 A1.

The content of oxygen in silicon single crystals is of crucial importance for the electrical and mechanical properties of the material. Applications e.g. in microelectronics require an oxygen content at a sufficiently high level, which on the other hand must not be too high. This facilitates the gettering of residual metallic impurities at oxygen-induced defects (precipitates) within the silicon slices, which leads to a high purity surface layer (so-called "intrinsic gettering").

The Czochralski process (i.e. the pulling of single crystals from the melt, which is the mostly used process for the production of silicon single crystals) causes, however, a more or less non-uniform axial and lateral distribution of oxygen within the crystals, because the thermal conditions are permanently changing during the process. These temperature variations affect the dissolution of the silica glass crucible, which contains the silicon melt. At present the oxygen concentration in the melt is controlled by guiding the inert gas flow in a special way above the melt surface or by varying crystal and crucible rotation rates. First place takes a reducing of the melt oxygen content.

A non-contaminating in-situ measurement of the oxygen concentration in the melt has not been possible up to now. Therefore, due to missing measurement data, an on-line control of the oxygen concentration is also not possible. This holds in a similar way for all other techniques for the production of silicon single crystals, e.g. for the floating zone method.

SUMMARY OF THE INVENTION

This invention aims at overcoming these problems by the description of an apparatus, which enables a control of the oxygen concentration in the melt and, by that, in the growing crystal without any additional impurity contamination. In particular this method is to facilitate the production of crystals with a defined, uniform axial and radial oxygen concentration.

The problem concerning the method described above is solved by measuring the oxygen concentration using an electrochemical solid ionic sensor; the electrochemical voltage is measured between the sensor and the growing silicon crystal.

A further extension of that idea is to control the oxygen concentration in the melt by applying a control voltage between the growing silicon crystal and the silica glass crucible contacted outside or a piece of silica glass touching the melt surface and contacted outside.

At the best it is possible to control the oxygen content in the melt and, by that, in the crystal grown from that melt by comparing the voltage, which is measured between the growing silicon crystal and the sensor, with a reference voltage and by applying a control voltage for correcting a possibly measured deviation from the reference voltage.

This method makes use of the fact that almost as much oxygen is incorporated into the crystal as the melt contents close to the crystal/melt phase boundary.

Of central importance for the invention are, therefore, the oxygen-conducting properties of silica glass at high temperatures of more than 1000° C. The invention facilitates for the first time a measurement and control of the oxygen concentration in the melt and consequently the oxygen concentration in the crystal grown from that melt. Therefore, crystals with a uniform oxygen distribution in axial and radial direction can be produced.

In the following the invention is described more clearly by a preferred embodiment, taken in conjunction with the following drawings.

DESCRIPTION OF THE PREFERRED EMBODIMENT

Figure 1:
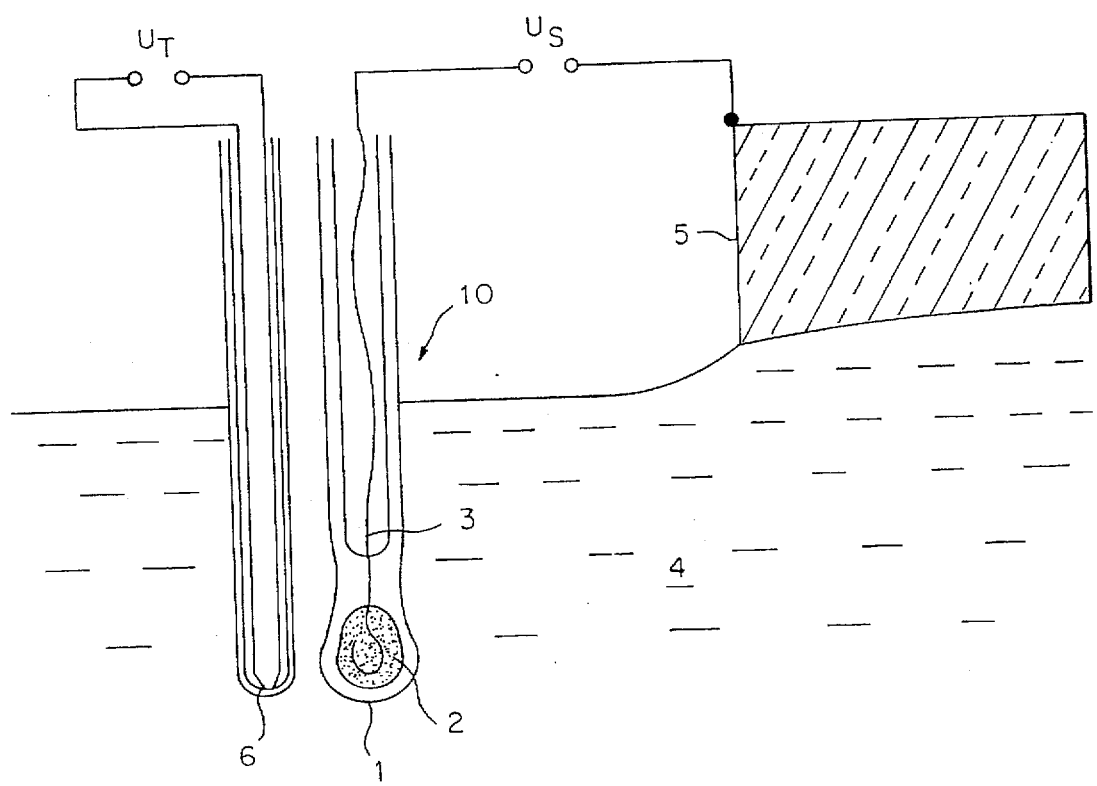
FIG. 1 shows a schematic drawing of a sensor according to the invention dipping into the melt, FIG. 2 schematically comprises a set-up according to the invention for the control of the oxygen content during the Czochralski process of silicon.

The set-up shown in FIG. 1 shows a closed silica glass tube 1 with a metal/metal oxide mixture 2 (e.g. $Cr/Cr_2O_3$) enclosed, which produces a defined temperature dependent oxygen reference partial pressure $p_r$ within the enclosure. The metal/metal oxide mixture is contacted by a wire 3. The melt 4 is contacted by the growing crystal 5. The temperature is measured by a thermocouple 6 shielded with silica glass. It is also possible to integrate the thermocouple 6 into the metal/metal oxide mixture 2 or in the silica glass tube 1. The sensor voltage $U_S$ is measured between crystal 5 and contact wire 3 and the thermo voltage $U_T$ at the thermocouple (from which the melt temperature has to be calculated). The molar oxygen fraction $n_o$ in the melt has to be calculated by the equation $$n_o = p_r^{1/2} \cdot \exp\left(\frac{-2UF - \Delta G^0}{RT}\right)$$

with sensor voltage U, Farady constant F, gas constant R, temperature T, reference oxygen partial pressure $p_r$ and flee-energy of solution $\Delta G^0$. $U_S$ and T are measured; all the other values are known from the literature or can be evaluated by individual measurements using common measurement techniques.

Figure 2:
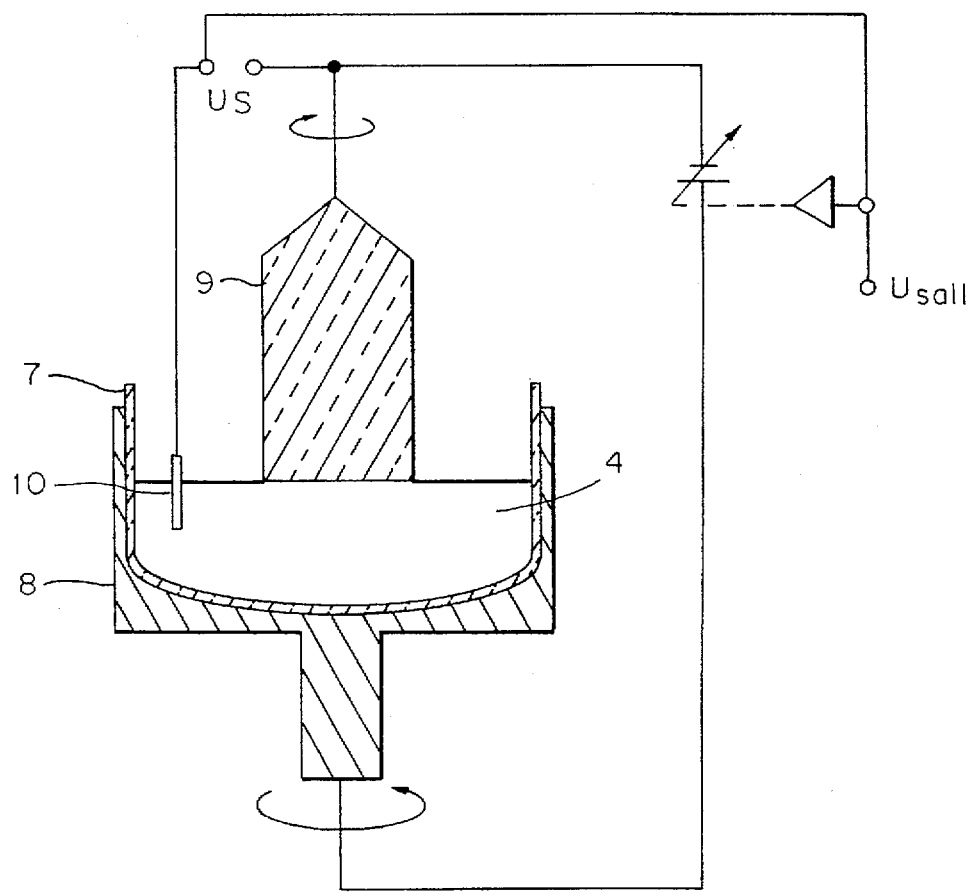

The oxygen ionic conduction of silica glass is also used for the part of the invention which deals with the control of the oxygen concentration described by the example of the Czochralski technique in FIG. 2. In this case the silica glass crucible 7, which contains the silicon melt 4, is used as the active oxygen ionic conductor by applying a sufficiently high voltage between the crucible susceptor 8 and the growing crystal 9. For an effective decrease of the oxygen content in the melt, the current density j at the phase boundary crucible/melt should at least compensate the chemical dissolution of the crucible 7. Assuming a typical chemical ablation of approximately 10 μm/h it relates to a current density j≧4 mA/cm. The sensor 10 described above can be combined with this method for adjusting the oxygen content to a control mechanism; but this control method can also be applied without the sensor.

This control mechanism can be applied to all techniques where a silicon melt can be contacted by a silica glass surface.

Figure 3:
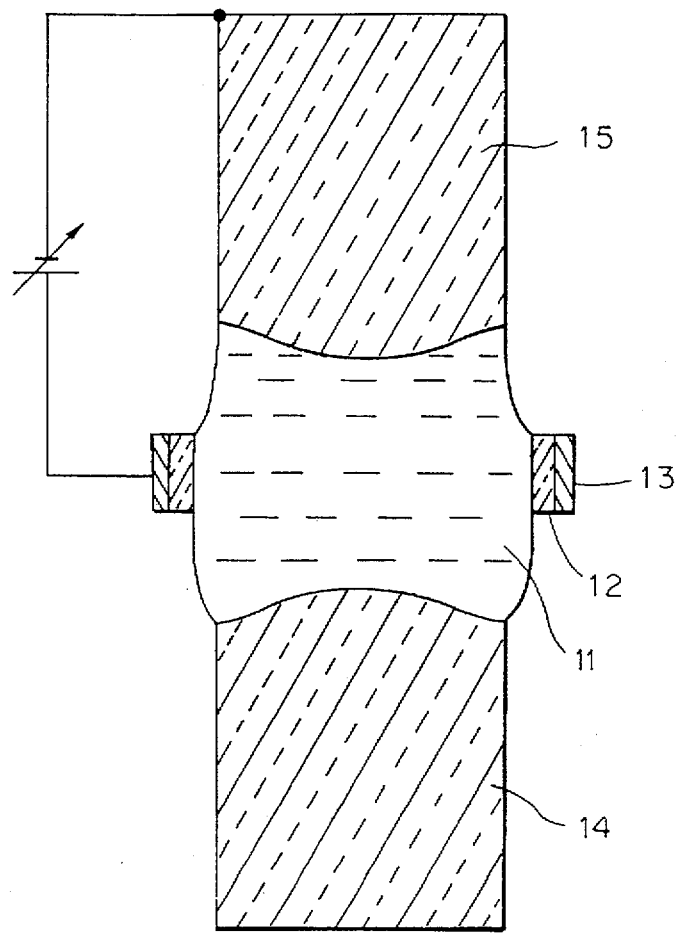
FIG. 3 is a scheme of the application of the method according to the invention for the floating zone method of silicon.

In a further example, FIG. 3 shows a possibility to control the oxygen content in the melt zone of a floating zone arrangement. The melt zone 11 is contacted by a silica glass ring 12; the control voltage is applied between an outside contact 13 and the growing silicon crystal 14 or the silicon rod 15.

The following example demonstrates the possibility of the measurement of the oxygen concentration by use of the sensor described above; simultaneously this shows the oxygen conductivity of silica glass at elevated temperatures, since this property is a prerequisite for the concentration measurement.

150 g silicon were melted within a silica glass crucible at 1 bar argon pressure (melt temperature: 1510° C.). A sensor 10 according to FIG. 1 was inserted; Mn/MnO was used as a reference mixture. After about 20 s the sensor voltage stabilizes at about 90 mV. The reference partial pressure for the temperature measured is $p_r = 2.3 \cdot 10^{-15}$. The free-energy of solution $\Delta G^o$ was determined by separate experiments to −118 kJ/mol. From this follows by use of the formula given above $n_o \approx 42$ ppm. This is in accordance with the solubility of oxygen in silicon melt, which had to be expected, since the melt was in equilibrium with silica glass.

What is claimed is:

1. A method for measuring and controlling the oxygen concentration in a silicon melt which is held in a silica glass crucible or which is contacted by a piece of silica glass, wherein the oxygen concentration is measured by an electrochemical solid ionic sensor dipped into the silicon melt and wherein a voltage is measured between the sensor and a silicon crystal growing from said melt, which voltage is related to the oxygen concentration of the silicon melt, wherein a control of the oxygen concentration is achieved by applying a control voltage between the growing silicon crystal and the silica glass crucible contacted from an outer surface of said crucible, or said piece of silica glass touching the melt surface and contacted from an outer surface of said glass, wherein the oxygen concentration of the melt and of the growing crystal is controlled by comparing the voltage, which is measured between the sensor and the growing crystal, with a reference voltage, which corresponds with the requested oxygen concentration, and wherein in the case of a deviation from the reference voltage the oxygen concentration is corrected by applying said control voltage.

2. Apparatus for measuring and controlling oxygen concentration in a silicon melt, comprising:

a measuring device to measure oxygen concentration of the silicon melt, including an electrochemical solid ionic sensor adapted to be dipped into the silicon melt, and a device for measuring voltage between said sensor and a growing silicon crystal, the measured voltage being related to oxygen concentration of the silicon melt;

a silica glass having a surface adapted to contact the silicon melt; and a control device for controlling oxygen concentration of the melt and of the growing crystal by comparing said measured voltage with a reference voltage corresponding with a desired oxygen concentration, and, in the case of a deviation from the reference voltage, applying a control voltage between the growing silicon crystal and a surface of the silica glass which is spaced from said surface adapted to be in contact with the silicon melt.

\* \* \* \* \*